US010746018B2

(12) United States Patent
Dumont et al.

(10) Patent No.: US 10,746,018 B2
(45) Date of Patent: Aug. 18, 2020

(54) SYSTEMS AND METHODS FOR IDENTIFYING TWO OR MORE CHARGES INTO RESERVOIR USING DOWNHOLE FLUID ANALYSIS

(71) Applicant: Schlumberger Technology Corporation, Sugar Land, TX (US)

(72) Inventors: Hadrien Dumont, Houston, TX (US); Vinay K. Mishra, Katy, TX (US); German Garcia, Katy, TX (US); Li Chen, Katy, TX (US); Thomas Pfeiffer, Sugar Land, TX (US); Soraya S. Betancourt Pocaterra, Katy, TX (US); Jerimiah Forsythe, Cambridge, MA (US); Andrew Emil Pomerantz, Lexington, MA (US); Youxiang Zuo, Burnaby (CA); Oliver C. Mullins, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 357 days.

(21) Appl. No.: 15/599,533

(22) Filed: May 19, 2017

(65) Prior Publication Data
US 2017/0342828 A1 Nov. 30, 2017

Related U.S. Application Data

(60) Provisional application No. 62/340,959, filed on May 24, 2016.

(51) Int. Cl.
*G06F 30/17* (2020.01)
*E21B 49/08* (2006.01)
(Continued)

(52) U.S. Cl.
CPC .............. *E21B 49/08* (2013.01); *E21B 49/10* (2013.01); *G06F 30/17* (2020.01); *E21B 2049/085* (2013.01); *G06F 30/28* (2020.01)

(58) Field of Classification Search
CPC ....... E21B 43/00; E21B 49/005; G01V 1/003; G06F 30/00
(Continued)

(56) References Cited

U.S. PATENT DOCUMENTS 9,562,198 B2 * 2/2017 Yusuf ................... B01D 17/044
10,101,484 B2 * 10/2018 Pomerantz ............ G01V 1/003
(Continued)

FOREIGN PATENT DOCUMENTS

WO 2014158376 A1 10/2014

*Primary Examiner* — Thai Q Phan
(74) *Attorney, Agent, or Firm* — Trevor G. Grove

(57) ABSTRACT

Systems and methods for identifying a likelihood that a reservoir of a geological formation received a secondary charge of hydrocarbons of relatively very different thermal maturity of composition are provided. One method includes positioning a downhole acquisition tool in a wellbore in a geological formation and testing one or more fluid properties of the formation fluid. Data processing circuitry may identify whether a relationship of the one or more fluid properties exceeds a first threshold that indicates likely asphaltene instability. When this is the case, data processing circuitry may be used to model the geological formation using a realization scenario in which multiple charges of hydrocarbons of substantially different thermal maturity or substantially different composition, or both, filled a reservoir of the geological formation over geologic time.

18 Claims, 11 Drawing Sheets

(51) Int. Cl.
*E21B 49/10* (2006.01)
*G06F 30/28* (2020.01)

(58) Field of Classification Search
USPC .......................... 703/2, 5, 7, 9, 12; 702/11
See application file for complete search history.

(56) References Cited

U.S. PATENT DOCUMENTS

| | | | |
|---|---|---|---|
| 10,184,334 B2* | 1/2019 | Betancourt-Pocaterra | ................... E21B 49/005 |
| 2014/0004863 A1* | 1/2014 | Zhang | ............... H04W 36/0033 455/444 |
| 2014/0238667 A1 | 8/2014 | Dumont et al. | |
| 2015/0247941 A1* | 9/2015 | Fiduk | ..................... G01V 1/003 702/11 |
| 2016/0168985 A1* | 6/2016 | Betancourt-Pocaterra | ................... E21B 49/005 73/152.04 |
| 2017/0016321 A1* | 1/2017 | Pan | ........................ E21B 43/00 |
| 2017/0284197 A1 | 10/2017 | Dumont et al. | |
| 2018/0223657 A1* | 8/2018 | Zuo | ........................ E21B 49/08 |

\* cited by examiner

SYSTEMS AND METHODS FOR IDENTIFYING TWO OR MORE CHARGES INTO RESERVOIR USING DOWNHOLE FLUID ANALYSIS

CROSS-REFERENCE TO RELATED APPLICATION

This application claims the benefit of U.S. Provisional Patent Application Ser. No. 62/340,959 filed May 24, 2016, the entire contents of which are hereby incorporated by reference into the current application.

BACKGROUND

This disclosure relates to identifying whether a reservoir likely received two or more hydrocarbon charges based on downhole fluid properties using downhole fluid analysis.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A hydrocarbon reservoir in a geological formation gradually forms over geologic time. An oil source rock, located in a basin, produces hydrocarbons, which migrate into a reservoir. In a normal time sequence of basin subsidence, the oil source rock initially generates heavier, less mature hydrocarbons with lower gas-oil ratio (GOR) and higher asphaltene content. At later times, with greater subsidence and high temperatures for longer times, the source rock generates lighter, more mature hydrocarbons. In some cases, a reservoir will contain predominantly a narrow range of maturities, while in other cases, the reservoir will contain a mixture of different maturity hydrocarbons.

The properties of the formation fluid have a substantial impact on well development and production. Asphaltene onset pressure (AOP), for example, describes a relationship between temperatures and pressures of the formation fluid at which the formation fluid begins to precipitate asphaltene components. During well development or production, it may be possible for the formation fluid to reach temperatures and pressures that cross the AOP envelope. When this happens, asphaltenes may begin to precipitate out of the formation fluid, which could result in a number of well-production challenges. Asphaltene precipitation can cause production-choking deposition inside tubulars and pipelines as well as a reduction in permeability of the reservoir rock. Thus, downhole tools may be used to estimate AOP of formation fluid downhole through downhole fluid analysis, or to obtain samples for testing at a laboratory at the surface.

In addition, scientists and engineers have developed complex computer models that simulate the behavior of the reservoir over geologic time. These models may be used to identify potential well-production concerns in advance. Well designers and producers may use the models to make well development and production decisions that proactively address these potential well-production concerns. There may be a very large number of possible realization scenarios that could describe the behavior of the reservoir over geologic time, however, and it may be difficult to identify which realization scenarios are most likely. The more likely the realization scenario that is used in the model, the more likely the model of the reservoir will accurately describe the behavior of the reservoir. To those involved in planning and producing the well, the accuracy of the reservoir model may impact plans for future field development plans and/or well operations, such as enhanced oil recovery, logging operations, and dynamic formation analyses.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure relates to identifying a likelihood that a reservoir of a geological formation received a secondary charge of hydrocarbons of relatively very different thermal maturity of composition. One method includes positioning a downhole acquisition tool in a wellbore in a geological formation and testing one or more fluid properties of the formation fluid. Data processing circuitry may identify whether a relationship of the one or more fluid properties exceeds a first threshold that indicates likely asphaltene instability. When this is the case, data processing circuitry may be used to model the geological formation using a realization scenario in which multiple charges of hydrocarbons of substantially different thermal maturity or substantially different composition, or both, filled a reservoir of the geological formation over geologic time.

In another example, one or more tangible, non-transitory, machine-readable media at least collectively comprising instructions executable on a processor to receive values of one or more fluid properties of formation fluid obtained using a downhole acquisition tool positioned in a geological formation and determine whether a relationship of the one or more fluid properties exceeds a first threshold that indicates likely asphaltene instability. When the relationship of the one or more fluid properties exceeds the first threshold, the instructions include modeling the geological formation using a realization scenario in which multiple charges of hydrocarbons of substantially different thermal maturity or substantially different composition, or both, filled a reservoir of the geological formation over geologic time.

In another example, a method includes positioning a downhole acquisition tool in a wellbore in a geological formation and testing one or more fluid properties of the formation fluid using the downhole acquisition tool. First data processing circuitry may identify whether a relationship of the one or more fluid properties exceeds one or more thresholds that indicates likely asphaltene instability. Based on whether the relationship of the one or more fluid properties exceeds one or more of the one or more thresholds, an indication may be output of a likelihood that a reservoir of the geological formation was filled over geologic time via multiple charges of hydrocarbons of substantially different thermal maturity or substantially different composition, or both.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
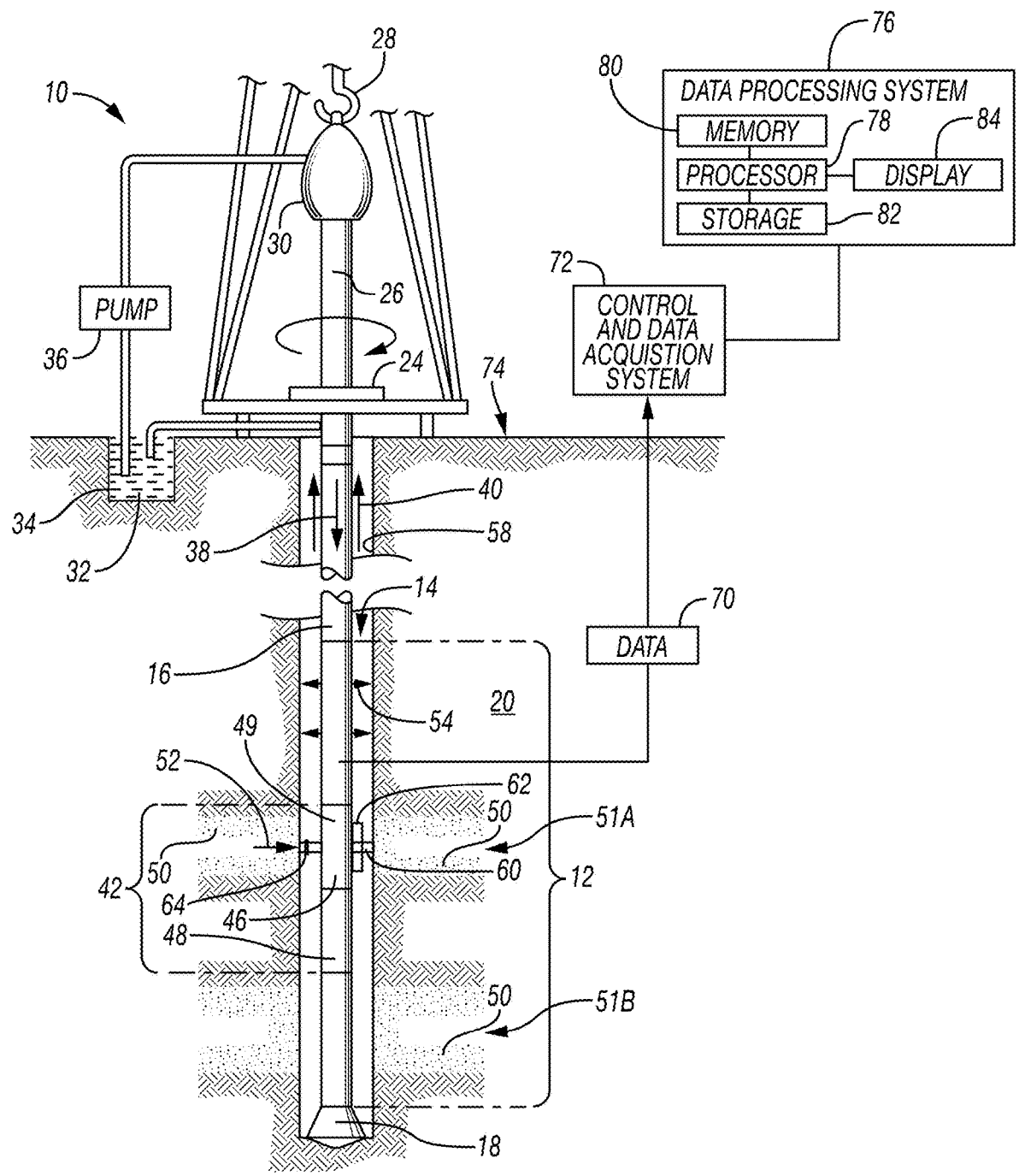
FIG. 1 is a schematic diagram of a downhole fluid analysis system that may be used to identify whether a reservoir likely underwent a single charge or multiple charges over geologic time, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Acquisition and analysis representative of formation fluids downhole in delayed or real time may be useful as inputs to reservoir modeling. A reservoir model based on downhole fluid analysis may predict or explain reservoir characteristics such as connectivity, productivity, lifecycle stages, type and timing of hydrocarbon, hydrocarbon contamination, and formation fluid dynamics, to provide a few examples. The reservoir model may simulate how hydrocarbons entered the reservoir in charges from one or more source rocks over geologic time. The manner in which the reservoir was charged over geologic time may have a substantial impact on the various well development and production issues in the present; as such, it is highly valuable to properly model the reservoir.

Indeed, in a normal time sequence of basin subsidence over geologic time, oil source rock initially generates heavier, less mature hydrocarbons with lower gas-oil ratio (GOR) and higher asphaltene content. At later times, with greater subsidence and high temperatures for longer times, the source rock generates lighter, more mature hydrocarbons. In some cases, a reservoir will contain predominantly a narrow range of maturities, while in other cases, a reservoir can contain a mixture of different maturity hydrocarbons. A narrow range of maturities may have within about 20-30% variation of GOR and/or asphaltene content, while different maturities may exceed 30% variation and could be as extreme as black oil and gas. There are two extreme descriptions of how an oil of a specific GOR and asphaltene content can occur at any point in the reservoir. This oil could result from multiple charges from the same or different oil source rocks, which mixes two hydrocarbons of very different maturities, or the oil could result from a single charge of a substantially single maturity. There are substantial differences in oil properties dependent on which description is more accurate.

If a single charge of a single maturity oil gave rise to the reservoir oil (at the point of measurement), then the asphaltenes will be relatively stable. Consequently, a tar mat or other asphaltene deposition would not be expected. By contrast, if two charges introduced hydrocarbons of very different maturity to mix in the reservoir, then the combined fluid may have less stable asphaltenes. The mixture of two fluids of very different maturities is called a mixing of incompatible fluids (with respect to asphaltene stability). In many cases, this mixing process can yield asphaltene instability, migration, and deposition.

Downhole acquisition tools may obtain measurements of fluid properties to identify the likely realization scenario of whether the reservoir underwent a single charge (and therefore likely contains more stable asphaltenes) or underwent multiple charges (and therefore likely contains less stable asphaltenes). This disclosure describes doing this using any suitable properties that relate to asphaltene stability, such as at least one downhole measurement of asphaltene onset pressure (AOP); at least one downhole measurement of AOP and at least one downhole measurement of reservoir pressure; or at least one downhole measurement of AOP, at least one downhole measurement of reservoir pressure, and at least one downhole measurement of bubble point; and/or at least two measurements at different respective depths of AOP and GOR. These properties may be used to identify a likely realization scenario (single charge or multiple charges of similar maturity or composition vs. multiple charges of very different maturity or composition). As used in this disclosure, a single charge or multiple charges of similar maturity or composition refers to any set of charges with properties suggestive of asphaltene stability, such as thermal maturities that differ within a range of about 20-30% variation of GOR and/or asphaltene content. Multiple charges of very different maturity or composition refers to any set of charges with properties suggestive of asphaltene instability, such as thermal maturities that differ by at least about 30% variation of GOR and/or asphaltene content, and could be as extreme as black oil and gas. The determined likely realization scenario may be used in a computer model of the reservoir or may be output for consideration to a well planner. This may have a substantial technical effect of facilitating improved well development, planning, and production. Indeed, understanding the dynamic processes affecting a particular reservoir may facilitate reservoir development, planning, and selecting appropriate enhanced oil recovery techniques to increase reservoir productivity.

Figure 2:
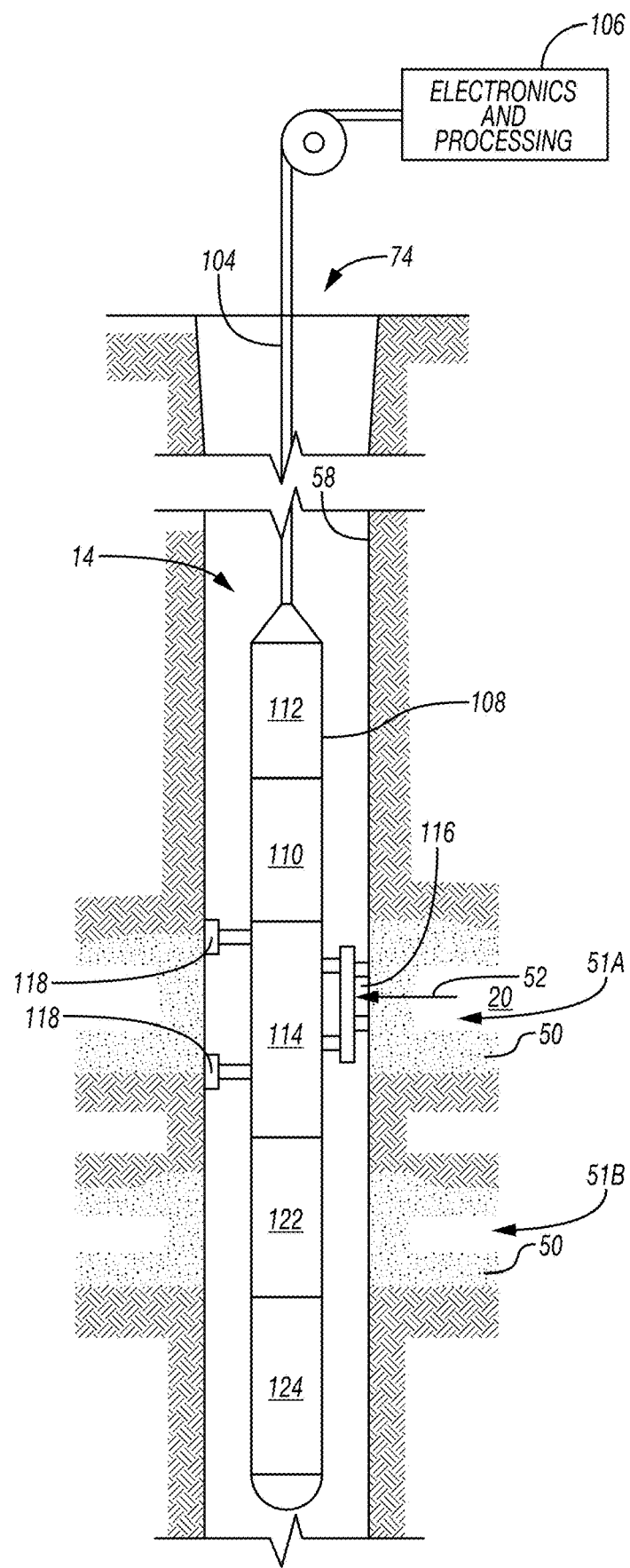
FIG. 2 is a schematic diagram of another example of a downhole fluid analysis system that may be used to identify whether a reservoir likely underwent a single charge or multiple charges, in accordance with an embodiment.

FIGS. 1 and 2 depict examples of wellsite systems that may employ fluid analysis systems and methods to model a reservoir. In FIG. 1, a rig 10 suspends a downhole acquisition tool 12 into a wellbore 14 via a drill string 16. A drill bit 18 drills into a geological formation 20 to form the wellbore 14. The drill string 16 is rotated by a rotary table 24, which engages a kelly 26 at the upper end of the drill string 16. The drill string 16 is suspended from a hook 28, attached to a traveling block, through the kelly 26 and a rotary swivel 30 that permits rotation of the drill string 16 relative to the hook 28. The rig 10 is depicted as a land-based platform and derrick assembly used to form the wellbore 14 by rotary drilling. However, in other embodiments, the rig 10 may be an offshore platform.

Drilling fluid referred to as drilling mud 32, is stored in a pit 34 formed at the wellsite. A pump 36 delivers the drilling mud 32 to the interior of the drill string 16 via a port in the swivel 30, inducing the drilling mud 32 to flow downwardly through the drill string 16 as indicated by a directional arrow 38. The drilling mud 32 exits the drill string 16 via ports in the drill bit 18, and then circulates upwardly through the region between the outside of the drill string 16 and the wall of the wellbore 14, called the annulus, as indicated by directional arrows 40. The drilling mud 32 lubricates the drill bit 18 and carries formation cuttings up to the surface as it is returned to the pit 34 for recirculation.

The downhole acquisition tool 12, sometimes referred to as a component of a bottom hole assembly ("BHA"), may be positioned near the drill bit 18 and may include various components with capabilities such as measuring, processing, and storing information, as well as communicating with the surface. Additionally or alternatively, the downhole acquisition tool 12 may be conveyed on wired drill pipe, a combination of wired drill pipe and wireline, or other suitable types of conveyance.

The downhole acquisition tool 12 may further include a downhole fluid analysis system 42, which may include a fluid communication module 46, a sampling module 48, and a sample bottle module 49. In a logging-while-drilling (LWD) configuration, the modules may be housed in a drill collar for performing various formation evaluation functions, such as pressure testing and fluid sampling, among others, and collecting representative samples of native formation fluid 50. The example of FIG. 1 includes two fluid zones 51A and 51B where the native formation fluid 50 may enter the wellbore 14, but it should be appreciated that any number of fluid zones (including a single fluid zone) may be present. The native formation fluid 50 from the fluid zones 51A and 51B may have different properties, particularly if the fluid zones 51A and 51B are hydraulically isolated from one another, but even if the fluid zones 51A and 51B are in communication. As shown in FIG. 1, the fluid communication module 46 is positioned adjacent the sampling module 48; however the position of the fluid communication module 46, as well as other modules, may vary in other embodiments. Additional devices, such as pumps, gauges, sensors, monitors or other devices usable in downhole sampling and/or testing also may be provided. The additional devices may be incorporated into modules 46 or 48 or disposed within separate modules included within the downhole fluid analysis system 42.

The downhole acquisition tool 12 may evaluate fluid properties of an obtained fluid 52. Generally, when the obtained fluid 52 is initially taken in by the downhole acquisition tool 12, the obtained fluid 52 may include some drilling mud 32, some mud filtrate 54 on a wall 58 of the wellbore 14, and the native formation fluid 50. To isolate the native formation fluid 50, the downhole acquisition tool 12 may identify an amount of contamination that is likely present in the obtained fluid 52. When the contamination level is sufficiently low, the obtained fluid 52 may substantially represent uncontaminated native formation fluid 50. In this way, the downhole acquisition tool 12 may store a sample of the native formation fluid 50 or perform a variety of in-situ testing to identify properties of the native formation fluid 50. Accordingly, the downhole fluid analysis system 42 may include sensors that may measure fluid properties such as gas-oil ratio (GOR); mass density; optical density (OD); composition of carbon dioxide ($CO_2$), $C_1$, $C_2$, $C_3$, $C_4$, $C_5$, and/or $C_{6+}$; formation volume factor; viscosity; resistivity; conductivity, fluorescence; compressibility; measurements of thermal maturity based on two-dimensional gas chromatography (specifically, thermal maturity markers Ts and Tm); measurements of asphaltene content; measurements of phase envelopes; and/or combinations of these properties of the obtained fluid 52. In one example, the downhole fluid analysis system 42 may include a pressure-volume-temperature (PVT) tester component that includes a volume that can change pressures using a piston or micropiston. The PVT tester component may be used to identify a pressure where the fluid held in its volume crosses a phase envelope. The PVT tester component may operate as described by Application No. PCT/US2014/015467, which is incorporated by reference herein in its entirety for all purposes. In addition, the downhole fluid analysis system 42 may be used to monitor mud filtrate contamination to determine an amount of the drilling mud filtrate 54 in the obtained fluid 52. When the amount of drilling mud filtrate 54 in the obtained fluid 52 falls beneath a desired threshold, the remaining native formation fluid 50 may be stored as a sample and/or tested.

The fluid communication module 46 includes a probe 60, which may be positioned in a stabilizer blade or rib 62. The probe 60 includes one or more inlets for receiving the obtained fluid 52 and one or more flowlines (not shown) extending into the downhole tool 12 for passing fluids (e.g., the obtained fluid 52) through the tool. In certain embodiments, the probe 60 may include a single inlet designed to direct the obtained fluid 52 into a flowline within the downhole acquisition tool 12. Further, in other embodiments, the probe 60 may include multiple inlets (e.g., a sampling probe and a guard probe) that may, for example, be used for focused sampling. In these embodiments, the probe 60 may be connected to a sampling flowline, as well as to guard flowlines. The probe 60 may be movable between extended and retracted positions for selectively engaging the wellbore wall 58 of the wellbore 14 and acquiring fluid samples from the geological formation 20. One or more setting pistons 64 may be provided to assist in positioning the fluid communication device against the wellbore wall 58.

The sensors within the downhole fluid analysis system 42 may collect and transmit data 70 from the measurement of the fluid properties and the composition of the obtained fluid 52 to a control and data acquisition system 72 at surface 74, where the data 70 may be stored and processed in a data processing system 76 of the control and data acquisition system 72. The data processing system 76 may include a processor 78, memory 80, storage 82, and/or display 84. The memory 80 may include one or more tangible, non-transitory, machine readable media collectively storing one or more sets of instructions for operating the downhole acquisition tool 12 and estimating an amount of mud filtrate 54 in the obtained fluid 52. The memory 80 may store mixing rules and algorithms associated with the native formation fluid 50 (e.g., uncontaminated formation fluid), the drilling mud 32, and combinations thereof to facilitate estimating an amount of the drilling mud 32 in the obtained fluid 52. The data processing system 76 may use the fluid property and composition information of the data 70 to estimate an amount of the mud filtrate in the obtained fluid 52 and/or model phase envelopes or other properties of the obtained fluid 52. These may be used in one or more equations of state (EOS) models describing the obtained fluid 52 (e.g., the native formation fluid 50) or, more generally, a reservoir in the geological formation 20 that may be modeled using any suitable data processing circuitry (e.g., at the wellsite, downhole, or remote from the wellsite). Accordingly, more accurate estimates of the phase envelopes of the obtained fluid 52 may likely result in more accurate EOS models.

To process the data 70, the processor 78 may execute instructions stored in the memory 80 and/or storage 82. For example, the instructions may cause the processor 78 to estimate fluid and compositional parameters of the native formation fluid 50 of the obtained fluid 52, and control flow rates of the sample and guard probes, and so forth. As such, the memory 80 and/or storage 82 of the data processing system 76 may be any suitable article of manufacture that can store the instructions. By way of example, the memory 80 and/or the storage 82 may be ROM memory, random-access memory (RAM), flash memory, an optical storage medium, or a hard disk drive. The display 84 may be any suitable electronic display that can display information (e.g., logs, tables, cross-plots, etc.) relating to properties of the well as measured by the downhole acquisition tool 12. It should be appreciated that, although the data processing system 76 is shown by way of example as being located at the surface 74, the data processing system 76 may be located in the downhole acquisition tool 12. In such embodiments, some of the data 70 may be processed and stored downhole (e.g., within the wellbore 14), while some of the data 70 may be sent to the surface 74 (e.g., in real time or near real time).

FIG. 2 depicts an example of a wireline downhole tool 100 that may employ the systems and methods of this disclosure. The downhole tool 100 is suspended in the wellbore 14 from the lower end of a multi-conductor cable 104 that is spooled on a winch at the surface 74. Like the downhole acquisition tool 12, the wireline downhole tool 100 may be conveyed on wired drill pipe, a combination of wired drill pipe and wireline, or any other suitable conveyance. The cable 104 is communicatively coupled to an electronics and processing system 106. The electronics and processing system 106 may be similar to the data processing system 76. The downhole tool 100 includes an elongated body 108 that houses modules 110, 112, 114, 122, and 124, that provide various functionalities including fluid sampling, sample bottle filling, fluid testing, operational control, and communication, among others. For example, the modules 110 and 112 may provide additional functionality such as fluid analysis, resistivity measurements, operational control, communications, coring, and/or imaging, among others.

As shown in FIG. 2, the module 114 is a fluid communication module 114 that has a selectively extendable probe 116 and backup pistons 118 that are arranged on opposite sides of the elongated body 108. The extendable probe 116 selectively seals off or isolates selected portions of the wall 58 of the wellbore 14 to fluidly couple to the adjacent geological formation 20 and/or to draw fluid samples from the geological formation 20. For example, the probe 116 may obtain and store some native formation fluid 50 from the first fluid zone 51A and obtain and store some native formation fluid 50 from the second fluid zone 51B. The probe 116 may include a single inlet or multiple inlets designed for guarded or focused sampling. The native formation fluid 50 may be expelled to the wellbore 14 through a port in the body 108 or the obtained fluid 52, including the native formation fluid 50, may be sent to one or more fluid sampling modules 122 and 124. The fluid sampling modules 122 and 124 may include sample chambers that store the obtained fluid 52. In the illustrated example, the electronics and processing system 106 and/or a downhole control system are configured to control the extendable probe assembly 116 and/or the drawing of a fluid sample from the geological formation 20 to enable analysis of the obtained fluid 52. The downhole fluid analysis system 42 may obtain a variety of measurements that can be used to identify phase envelope boundaries of formation fluids 50.

Figure 3:
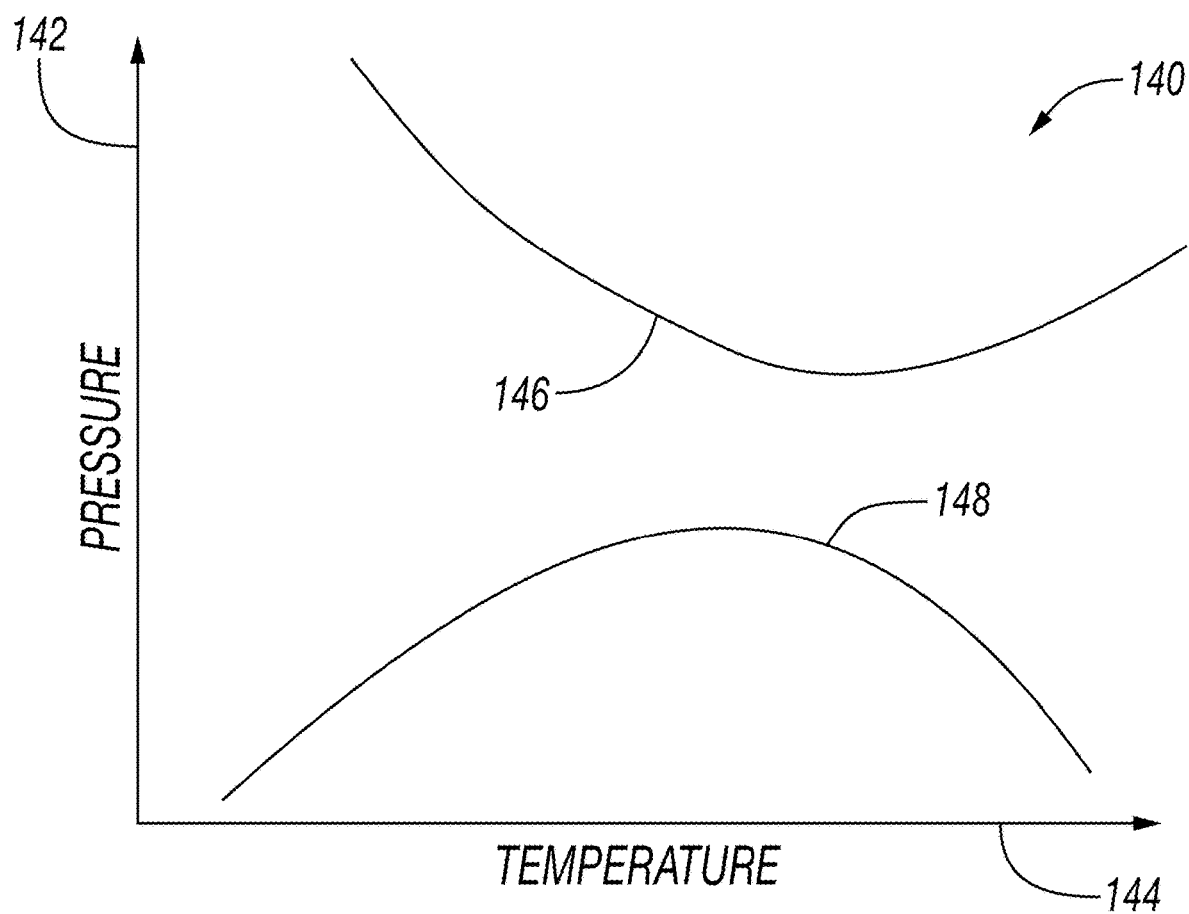
FIG. 3 is a plot of a phase diagram of formation fluid showing asphaltene onset pressure (AOP) and saturation pressure (PSAT), also referred to as "bubble point" pressure, in accordance with an embodiment.

A phase diagram 140 shown in FIG. 3 illustrates two phase envelopes that may describe the phase behavior of a formation fluid 50. The phase diagram 140 describes behavior of the formation fluid 50 at various pressures (ordinate 142) and temperatures (abscissa 144). The phase envelopes represented in the phase diagram 140 include an asphaltene onset pressure (AOP) phase envelope 146 and a saturation pressure (PSAT) phase envelope 148. Other phase envelopes that may describe the behavior of the formation fluid 50, but which are not expressly shown in FIG. 3, include wax appearance temperature (WAT) and others relating to more exotic phases.

On different sides of the phase envelopes 146 and 148, the formation fluid 50 may have different phase behavior. For example, the saturation pressure (PSAT) phase envelope 148 describes the relationship between temperatures and pressure delineating liquid vs. gas behavior. When the formation fluid 50 is at a temperature and pressure above the PSAT phase envelope 148, the formation fluid 50 may be substantially gas-free, but when the formation fluid 50 is at a temperature and pressure beneath the PSAT phase envelope 148, gas bubbles may begin to form in the formation fluid 50. In another example, the asphaltene onset pressure (AOP) phase envelope 146 describes the relationship between temperature and pressure delineating the appearance of asphaltene components in the formation fluid 50. When the formation fluid 50 is at a temperature and pressure above the AOP phase envelope 146, the formation fluid 50 may be substantially free of asphaltenes, but when the formation fluid 50 is at a temperature and pressure beneath the AOP phase envelope 146, asphaltene components may begin to fall out of solution in the formation fluid 50.

If AOP is very high, it is likely that incompatible fluids entered the reservoir. That is, the fluids in the reservoir are likely to be of very different maturity; the formation fluid appears to be a mixture of low maturity fluids and high maturity fluids or gas. Here, "incompatible" means that asphaltenes are destabilized in this mixture of fluids. In addition, the expectation is that over ½ the asphaltene may drop out at pressures lower than the AOP but higher than the "bubble point" (PSAT). At pressures below bubble point, asphaltene becomes more soluble and so does not drop our further.

The phase behavior of the formation fluid 50, as described by the phase envelopes 146 and 148, may have a substantial impact on the well. As formation fluids are produced, the formation fluids may experience a range of temperatures and pressures. Namely, when formation fluid is extracted from the well, the temperatures and pressures of the well may gradually decrease. At some point, the temperatures and pressures may reach the "bubble point" when the fluid breaks phase at the saturation pressure (PSAT), producing gaseous and liquid phases. In addition, the formation fluid may break phase in the formation itself during production. For example, one zone of the formation may contain oil with dissolved gas. During production, the formation pressure may drop to the extent that the bubble point pressure is reached, allowing gas to emerge from the oil, causing production concerns. At times, too, the formation fluid may experience changes in pressure and temperature that cause asphaltenes to begin to appear, which could result in production-choking "tar mats."

The downhole fluid analysis system 42 may obtain an estimate of PSAT and/or AOP using any suitable technique. For example, the estimate of PSAT or AOP may be determined as described in U.S. patent application Ser. No. 15/087,770, "Methods for In-Situ Multi-Temperature Measurements Using Downhole Acquisition Tool," published as U.S. Pub. No. 207/0284197, which is incorporated by reference herein in its entirety for all purposes. Additionally or alternatively, the AOP may be determined while pulling out of hole as described in U.S. patent application Ser. No. 13/829,097, "Downhole Fluid Analysis Methods," published as U.S. Pub. No. 20140238667, which is incorporated by reference herein in its entirety for all purposes.

The measurement of AOP, whether alone or combined with other measurements, may be used to identify whether the reservoir likely received a single charge of hydrocarbons or multiple charges of hydrocarbons over geologic time. This may be used to select a more likely realization scenario for modeling the reservoir. With a more accurate realization scenario, the model of the reservoir will be more likely to be accurate, allowing well planners to make informed planning, development, and production decisions.

Figure 4:
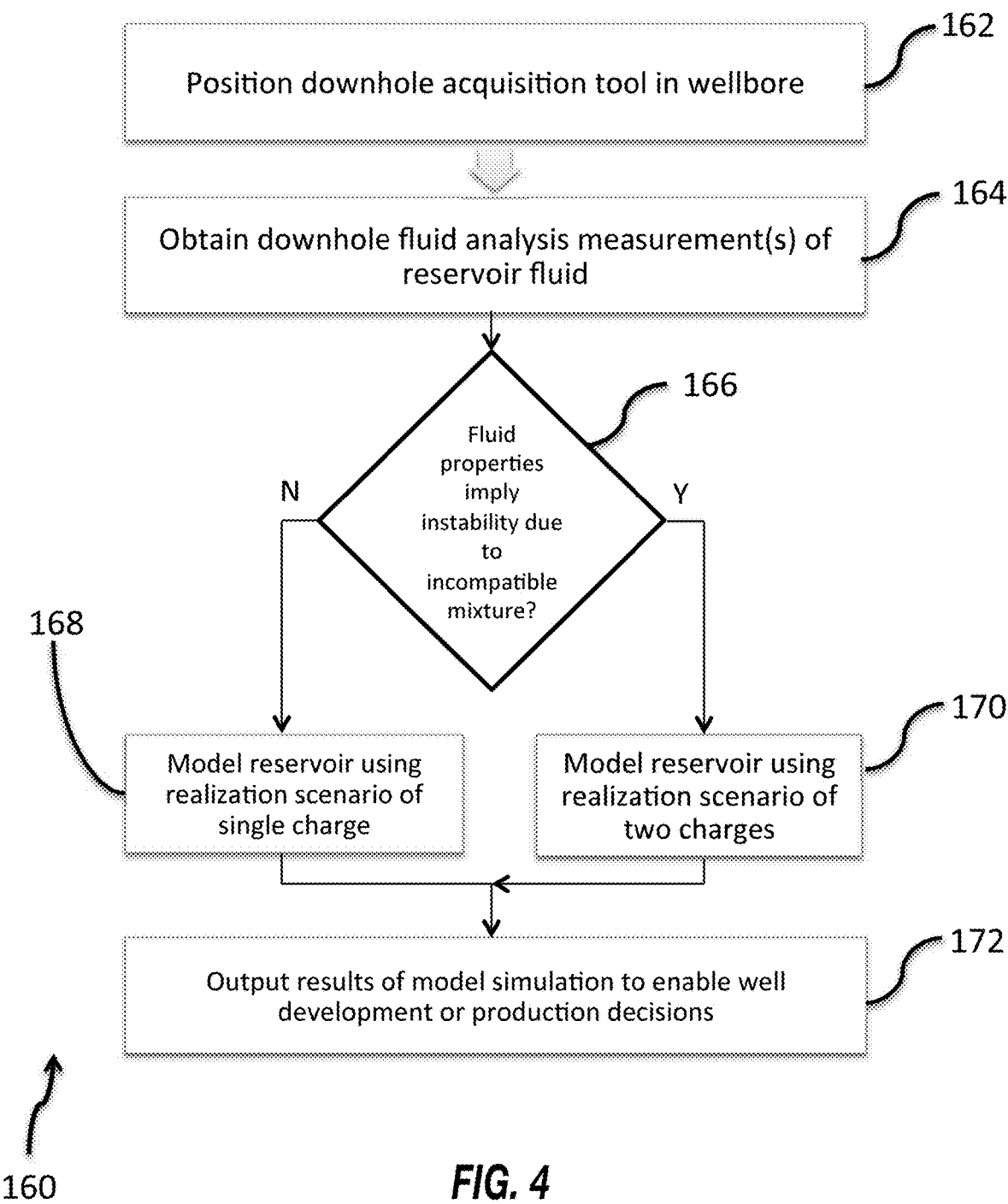
FIG. 4 is a flowchart of a method for identifying whether a reservoir likely underwent a single charge or multiple charges based on one or more fluid properties (e.g., asphaltene onset pressure (AOP), reservoir pressure, bubble point pressure, and/or gas-oil ratio (GOR)), in accordance with an embodiment.

For example, as shown in a flowchart 160 of FIG. 4, a downhole acquisition tool 12 or downhole acquisition tool 100 having the downhole fluid analysis system 42 may be positioned in the wellbore 14 (block 162). The downhole fluid analysis system 42 may obtain one or more fluid measurements that relate to the asphaltene stability of the formation fluid 50 (block 164). As will be discussed in greater detail below, the one or more fluid measurements may include, for example:

1. At least one measurement of asphaltene onset pressure (AOP) from a depth in the wellbore 14; or
2. At least one measurement of AOP and at least one measurement of reservoir pressure from a depth in the wellbore 14; or
3. At least one measurement of AOP, at least one measurement of reservoir pressure, and at least one measurement of bubble point pressure from a depth in the wellbore 14; or
4. At least two measurements of AOP and at least two measurements of gas-oil ratio (GOR) from at least two respective depths in the wellbore 14.

Moreover, the mixture of incompatible fluids implies that the current GOR and asphaltene content does not match the thermal maturity biomarkers of the oil. The thermal maturity biomarkers in the oil are enriched in low maturity fluids and are of much lower concentration in high maturity fluids. Thus, a mixture of different maturity fluids would have thermal maturity biomarkers that are indicative of the lower maturity fluid in the mixture. As such, other properties that may be considered include comparisons of the AOP indication of maturity with indications of maturity from two-dimensional gas chromatography (specifically, thermal maturity biomarkers Ts and Tm, though other thermal maturity biomarkers may be used as well). Mixtures of different maturities would be expected to have a high fraction of $Tm/(Tm+Ts)$ (e.g., a relatively large ratio may be about 0.8 or higher, while a relatively small ratio may be about 0.4 or smaller) compared to the GOR and asphaltene content.

The one or more downhole fluid analysis measurements may be analyzed by the data processing system 76 or electronics and processing system 106 to determine whether the fluid properties indicated by the measurement(s) likely indicate asphaltene instability due to an incompatible mixture of fluids (decision block 166). This may involve analyzing the one or more downhole fluid analysis measurements for fluid properties that exceed some threshold indicating that the properties are likely to have occurred if multiple charges of hydrocarbons of different composition or maturity had filled the reservoir (rather than a single charge of similar thermal maturities or composition or multiple charges of similar thermal maturities or composition). Various examples are provided in this disclosure, but it should be understood that any suitable measurement or relationship of measurements that indicate the asphaltene stability of the formation fluid 50 may be used for analysis.

If the fluid properties do not indicate likely asphaltene instability due to an incompatible mixture of fluids (decision block 166), the reservoir may be modeled using a realization scenario of a single hydrocarbon charge (or multiple charges of relatively similar thermal maturities or compositions) (block 168). By contrast, if the fluid properties do indicate likely asphaltene instability due to an incompatible mixture of fluids (decision block 166), the reservoir may be modeled using a realization scenario of multiple hydrocarbon charges of different maturities (block 170). Modeling the reservoir in this way may result in a more accurate simulation of the reservoir, and may be done using any suitable geological or geodynamic modeling simulations running on data processing circuitry. Thus, results of the model simulation may be output to enable a well planner to make well development or production decisions (block 172). For example, the results of the model simulation may allow a well planner to select appropriate enhanced oil recovery techniques to increase reservoir productivity.

Figure 5:
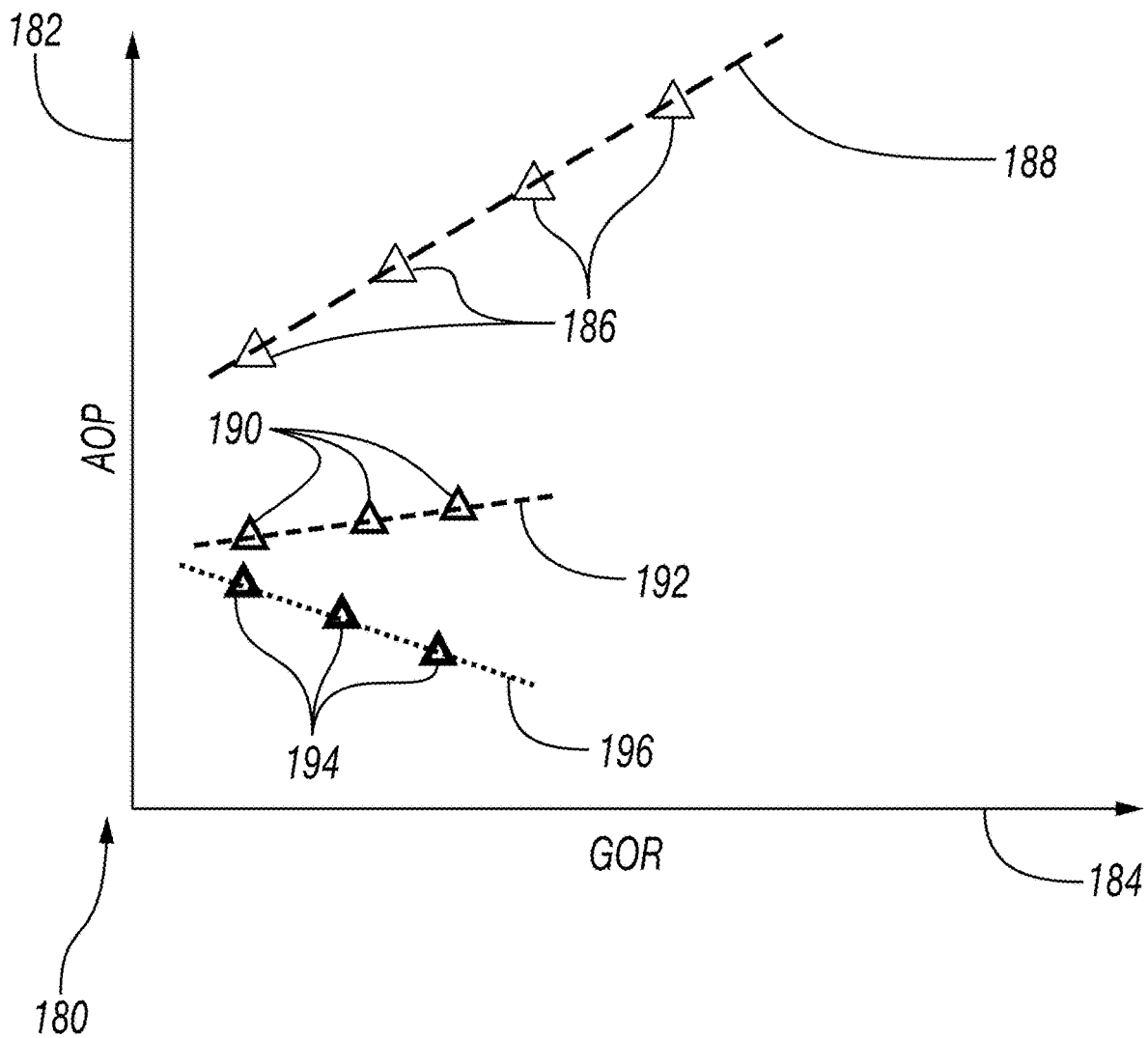
FIG. 5 is a diagram illustrating a relationship between asphaltene onset pressure (AOP) and gas-oil ratio (GOR), which may be used to estimate a likelihood of whether a reservoir likely underwent a single charge or multiple charges.

FIG. 5 is a plot 180 simulating measurements of asphaltene onset pressure (AOP) (ordinate 182) and gas-oil ratio (GOR) (abscissa 184) from three example wells. The plot 180 includes sample data points 186 that simulate measurements taken from different depths within a first well. The data points 186 include a relatively high value of AOP (e.g., greater than 10,000 psi). The data points 186 form the basis of a trend line 188 that has a relatively large positive slope (e.g., greater than 5 psi/scf/bbl). The relatively high AOP and/or the relatively large positive slope of $$\frac{\delta AOP}{\delta GOR}$$

suggests that the formation fluid obtained from the first well may have a relatively high asphaltene instability that is due to mixed charges of different thermal maturity oil.

Data points 190 represent simulated data points taken from different depths of a second well. The data points 190 include a comparatively lower value of AOP (e.g., less than 10,000 psi). The data points 190 form the basis of a trend line 192 that has a relatively small positive slope (e.g., less than 5 psi/scf/bbl). The relatively low AOP and/or the relatively small slope of $$\frac{\delta AOP}{\delta GOR}$$

suggests that the formation fluid obtained from the second well may have a relatively low asphaltene instability, which may arise when the reservoir is filled by a single charge with hydrocarbons of relatively similar thermal maturity or composition (or by multiple charges with hydrocarbons of relatively similar thermal maturity or composition).

Data points 194 represent simulated data points taken from different depths of a third well. The data points 194 include even lower values of AOP. The data points 194 form the basis of a trend line 196 that has a negative slope. The low AOP and/or the negative slope of $$\frac{\delta AOP}{\delta GOR}$$

suggests that the formation fluid obtained from the third well may also have a relatively low asphaltene instability, which may arise when the reservoir is filled by a single charge with hydrocarbons of relatively similar thermal maturity or composition (or by multiple charges with hydrocarbons of relatively similar thermal maturity or composition).

Figure 6:
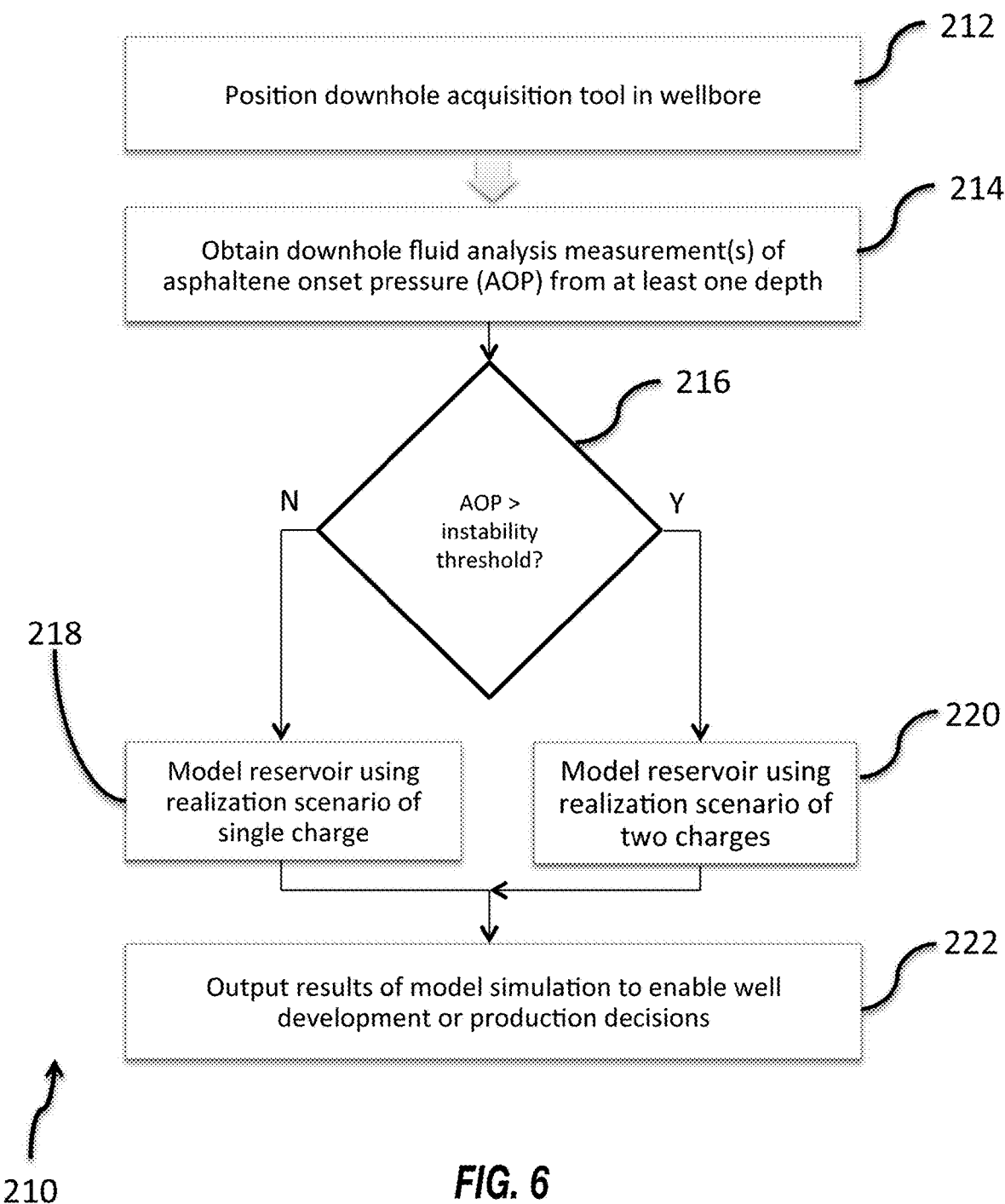
FIG. 6 is a flowchart of a method for identifying whether a reservoir likely underwent a single charge or multiple charges based on a measurement of asphaltene onset pressure (AOP) determined by a downhole acquisition tool, in accordance with an embodiment.
Figure 7:
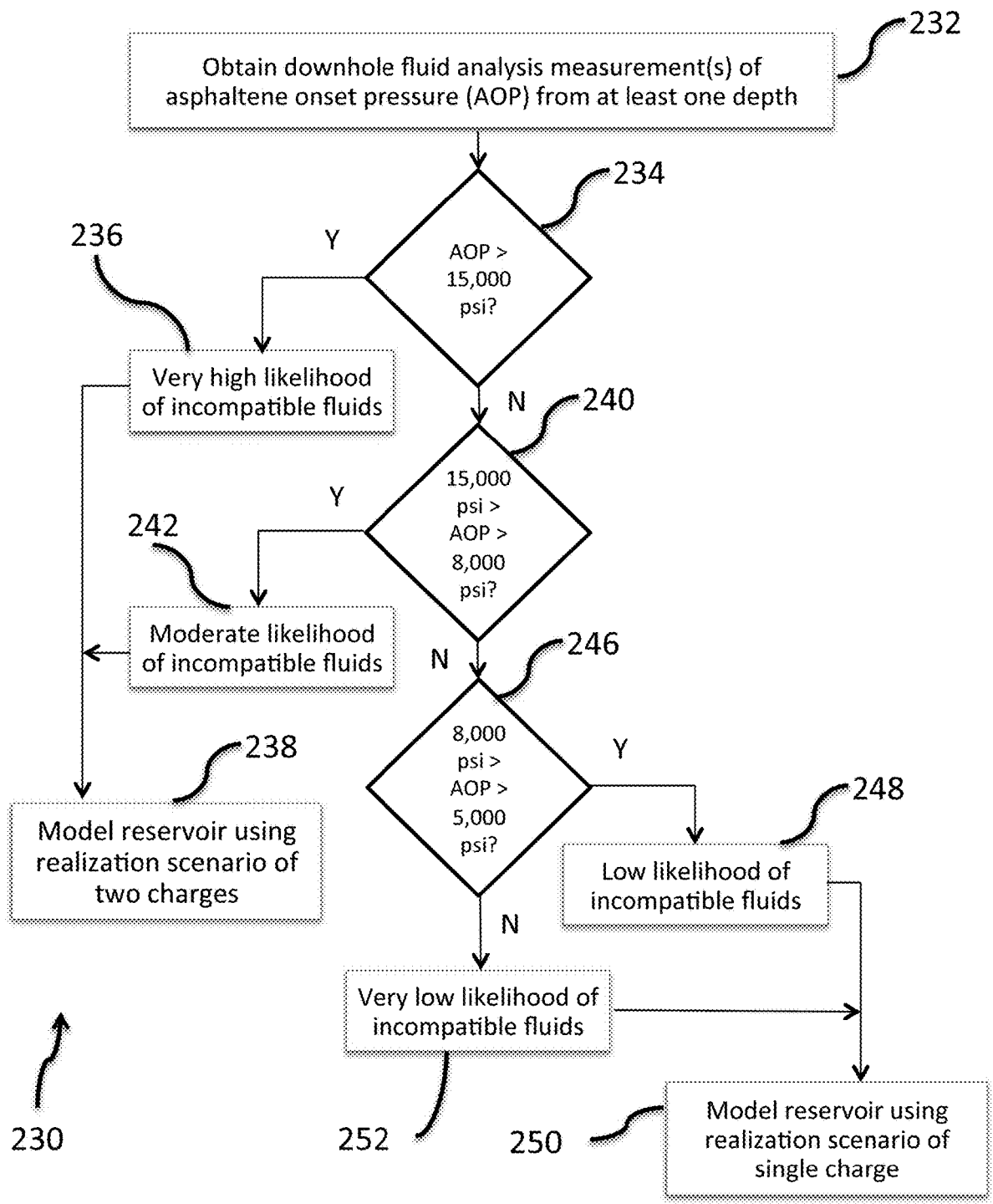
FIG. 7 is a flowchart of a method for identifying certain discrete levels of likeliness of whether a reservoir underwent a single charge or multiple charges based on a measurement of asphaltene onset pressure (AOP) determined by a downhole acquisition tool, in accordance with an embodiment.

As can be seen by the plot 180 of FIG. 5, asphaltene onset pressure (AOP) may serve as an indicator of mixed oil (native and secondary) that results in destabilized oil that may be prone to asphaltene dropout due to depletion and/or due to cooling while being produced. A measurement of AOP may be used in an absolute fashion, as described in FIGS. 6 and 7, or may be used in concert with other measurements, as described by FIGS. 8-10. In FIG. 6, a flowchart 210 represents a particular example of the flowchart 160 of FIG. 4. Thus, the flowchart 210 begins as the downhole acquisition tool 12 or downhole acquisition tool 100 having the downhole fluid analysis system 42 is positioned in the wellbore 14 (block 212). The downhole fluid analysis system 42 may obtain at least one measurement of AOP from at least one depth (block 214). It should be appreciated that additional measurements of AOP from different depths may be obtained and averaged or weighted, if desired.

The AOP measurement(s) may be analyzed by the data processing system 76 or electronics and processing system 106 to determine whether the AOP exceeds an instability threshold (decision block 216). The instability threshold may be a fixed value or may vary (e.g., based on other measured properties). Depending on a desired level of uncertainty, the instability threshold may be, for example: 15,000 psi; 14,000 psi; 13,000 psi; 12,000 psi; 11,000 psi; 10,000 psi; 9,000 psi; 8,000 psi; or the like. In one particular example, the instability threshold is 10,000.

Thus, if the AOP does not exceed the instability threshold, this may indicate a relatively lower likelihood of asphaltene instability due to an incompatible mixture of fluids (decision block 216), and so the reservoir may be modeled using a realization scenario of a single hydrocarbon charge (or multiple charges of relatively similar thermal maturities or compositions) (block 218). By contrast, if the AOP does exceed the instability threshold, this may indicate a relatively higher likelihood of asphaltene instability due to an incompatible mixture of fluids (decision block 216), and so the reservoir may be modeled using a realization scenario of multiple hydrocarbon charges of different maturities or compositions (block 220). Modeling the reservoir in this way may result in a more accurate simulation of the reservoir. Thus, results of the model simulation may be output to enable a well planner to make well development or production decisions (block 222). For example, the results of the model simulation may allow a well planner to select appropriate enhanced oil recovery techniques to increase reservoir productivity.

Because the absolute value of AOP may signal different likelihoods of multiple charges of different thermal maturity or composition, specific likelihoods may be assigned based on the absolute value of AOP. One example of this appears in a flowchart 230 of FIG. 7. The flowchart 230 of FIG. 7 begins as the downhole fluid analysis system 42 obtains at least one measurement of AOP from at least one depth (block 232). It should be appreciated that additional measurements of AOP from different depths may be obtained and averaged or weighted, if desired.

The AOP measurement(s) may be analyzed by the data processing system 76 or electronics and processing system 106 to determine whether the AOP exceeds one of several possible instability thresholds. For example, if the AOP exceeds some relatively high-confidence value of instability (e.g., a value between about 10,000 psi to about 20,000; in the specific example shown, 15,000 psi) (decision block 234), this may suggest a very high likelihood of incompatible fluids (block 236). As such, the reservoir may be modeled using a realization scenario of multiple hydrocarbon charges of different maturities or compositions (block 238). If the AOP is less than the high-confidence value of instability but greater than a medium-confidence value of instability (e.g., a value between about 5,000 psi to 12,000 psi; in the specific example shown, 8,000 psi) (decision block 240), this may suggest a relatively moderate likelihood of incompatible fluids (block 242). In this case, as well, the reservoir may be modeled using a realization scenario of multiple hydrocarbon charges of different maturities or compositions (block 238).

If the AOP is less than the medium-confidence value of instability but greater than a high-confidence value of stability (e.g., less than about 6,000 psi; in the specific example shown, 5,000 psi) (decision block 246), this may suggest a relatively low likelihood of incompatible fluids (block 248). As such, the reservoir may be modeled using a realization scenario of a single hydrocarbon charge of relatively similar maturities or compositions (or multiple hydrocarbon charges of relatively similar maturities or compositions) (block 250). If the AOP is less than the high-confidence value of stability (decision block 246), this may suggest a very low likelihood of incompatible fluids (block 252). In this case, as well, the reservoir may be modeled using a realization scenario of a single hydrocarbon charge of relatively similar maturities or compositions (or multiple hydrocarbon charges of relatively similar maturities or compositions) (block 250).

Figure 8:
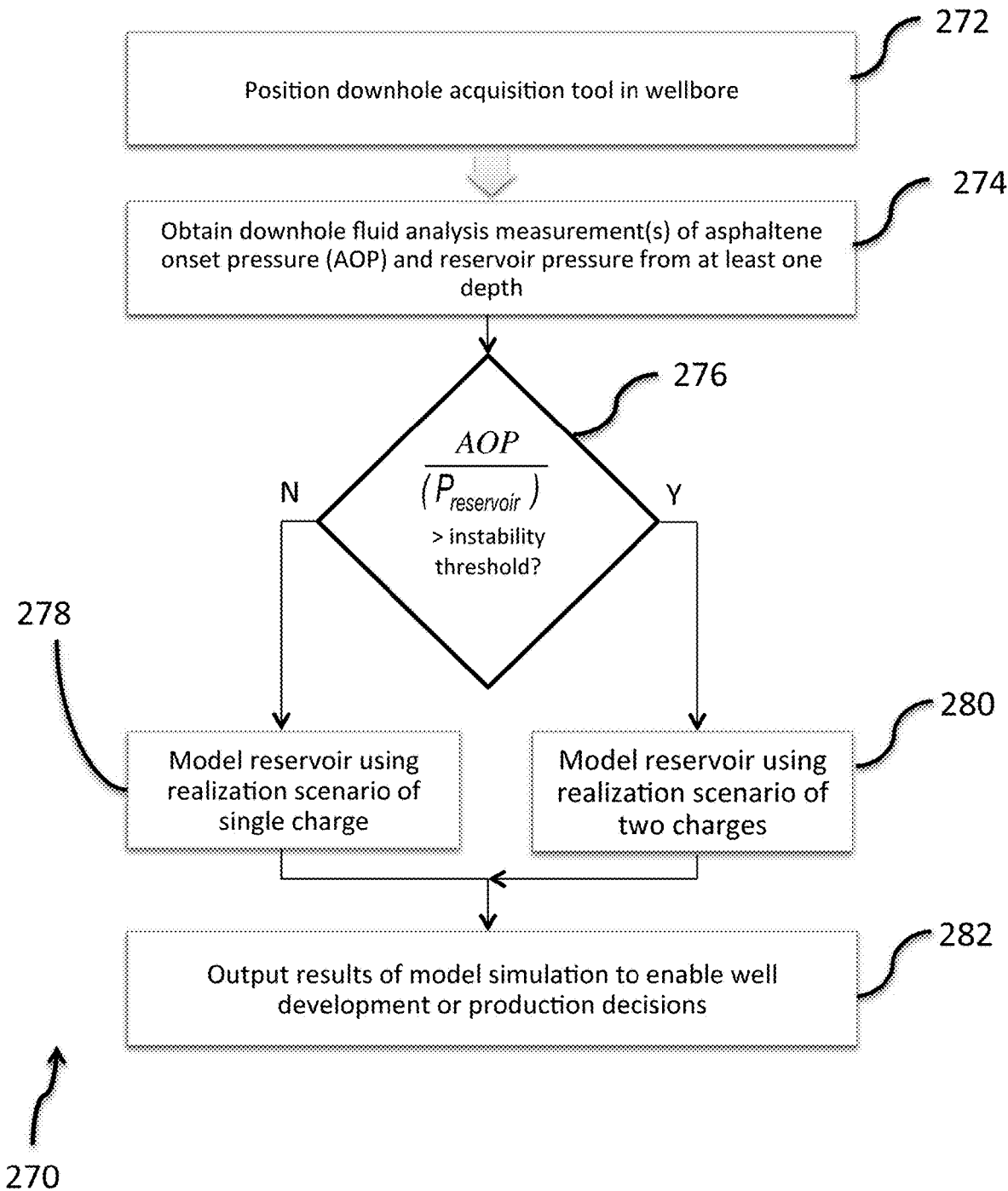
FIG. 8 is a flowchart of a method for identifying whether a reservoir likely underwent a single charge or multiple charges based on a measurement of asphaltene onset pressure (AOP) and reservoir pressure as determined by a downhole acquisition tool, in accordance with an embodiment.

As noted above, AOP may also be related to other measurements to identify when multiple charges have filled the reservoir with hydrocarbons of differing thermal maturities or compositions. FIG. 8, for example, illustrates a flowchart 270 in which AOP is compared to reservoir pressure. The flowchart 270 begins as the downhole acquisition tool 12 or downhole acquisition tool 100 having the downhole fluid analysis system 42 is positioned in the wellbore 14 (block 272). The downhole fluid analysis system 42 may obtain at least one measurement of AOP and at least one measurement of reservoir pressure ($P_{reservoir}$) from at least one depth (block 274). It should be appreciated that additional measurements of AOP or $P_{reservoir}$ from different depths may be obtained and averaged or weighted, respectively, if desired.

The AOP and $P_{reservoir}$ measurement(s) may be analyzed by the data processing system 76 or electronics and processing system 106 to determine whether a ratio of AOP to $P_{reservoir}$ exceeds an instability threshold (decision block 216). The instability threshold may be a fixed value or may vary (e.g., based on other measured properties). Depending on a desired level of uncertainty, the instability threshold may be, for example: 0.3, 0.4, 0.5, 0.6, 0.7, or the like. In one particular example, the instability threshold is 0.5 or about 0.5.

Thus, if the ratio of AOP to $P_{reservoir}$ does not exceed the instability threshold, this may indicate a relatively lower likelihood of asphaltene instability due to an incompatible mixture of fluids (decision block 276), and so the reservoir may be modeled using a realization scenario of a single hydrocarbon charge (or multiple charges of relatively similar thermal maturities or compositions) (block 278). By contrast, if the ratio of AOP to $P_{reservoir}$ does exceed the instability threshold, this may indicate a relatively higher likelihood of asphaltene instability due to an incompatible mixture of fluids (decision block 276), and so the reservoir may be modeled using a realization scenario of multiple hydrocarbon charges of different maturities or compositions (block 280). Modeling the reservoir in this way may result in a more accurate simulation of the reservoir. Thus, results of the model simulation may be output to enable a well planner to make well development or production decisions (block 282). For example, the results of the model simulation may allow a well planner to select appropriate enhanced oil recovery techniques to increase reservoir productivity.

Figure 9:
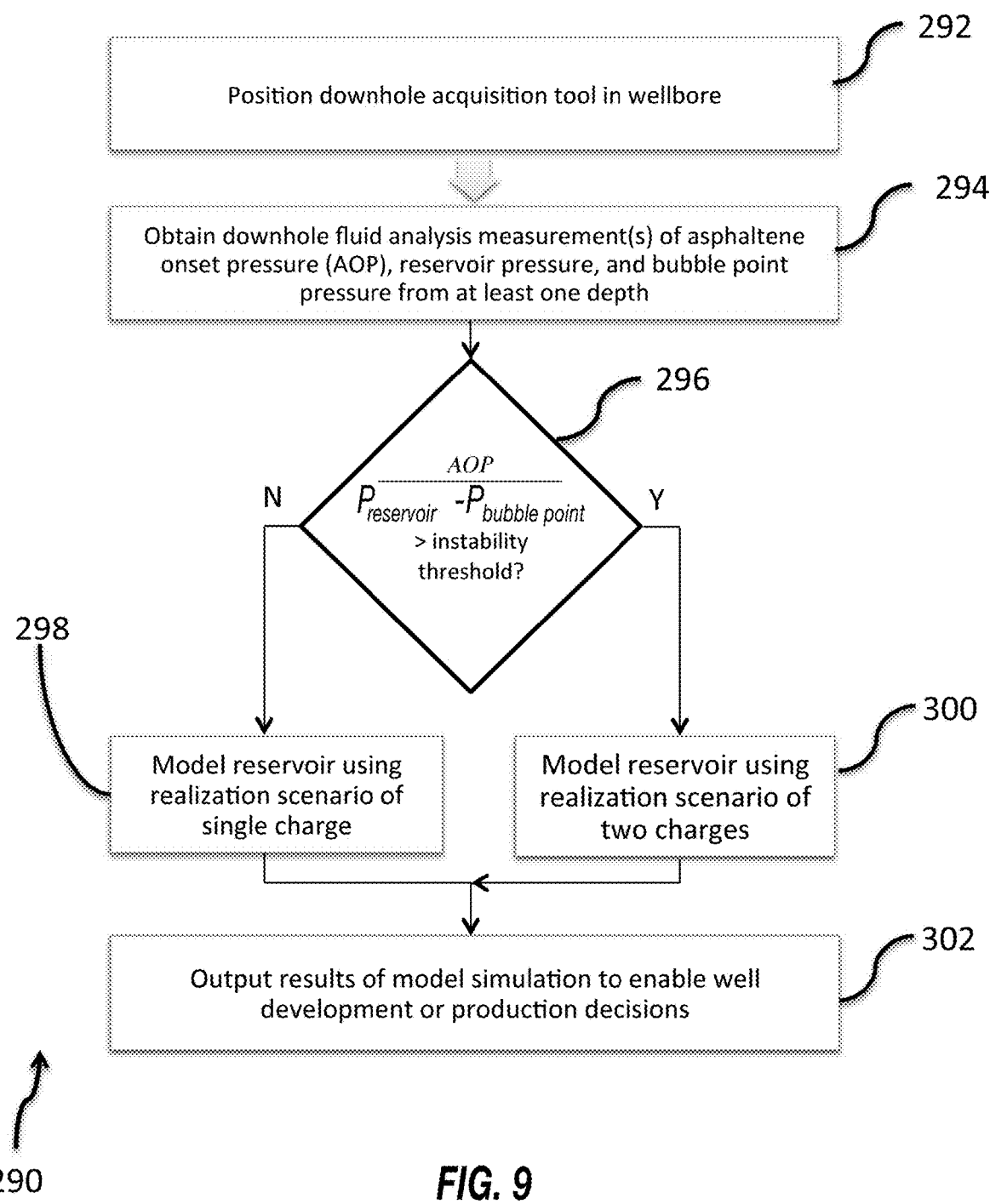
FIG. 9 is a flowchart of a method for identifying whether a reservoir likely underwent a single charge or multiple charges based on a measurement of asphaltene onset pressure (AOP), reservoir pressure, and bubble point pressure as determined by a downhole acquisition tool, in accordance with an embodiment.

In another example, shown by a flowchart 290 of FIG. 9, AOP may be related to reservoir pressure and bubble point pressure to identify whether the reservoir was likely filled by multiple charges of hydrocarbons of different thermal maturities or compositions. The flowchart 290 begins as the downhole acquisition tool 12 or downhole acquisition tool 100 having the downhole fluid analysis system 42 is positioned in the wellbore 14 (block 292). The downhole fluid analysis system 42 may obtain at least one measurement of AOP, at least one measurement of reservoir pressure ($P_{reservoir}$), and at least one measurement of bubble point pressure ($P_{bubble\ point}$) from at least one depth (block 294). It should be appreciated that additional measurements of AOP, $P_{reservoir}$, or $P_{bubble\ point}$ from different depths may be obtained and averaged or weighted, respectively, if desired.

The AOP, $P_{reservoir}$, and $P_{bubble\ point}$ measurement(s) may be analyzed by the data processing system 76 or electronics and processing system 106 to determine whether a ratio of AOP to a difference between $P_{reservoir}$ and $P_{bubble\ point}$ exceeds an instability threshold (decision block 296). The instability threshold may be a fixed value or may vary (e.g., based on other measured properties). Depending on a desired level of uncertainty, the instability threshold may be, for example: 0.5, 0.6, 0.7, 0.8, 0.9 or the like. In one particular example, the instability threshold is 0.7 or about 0.7.

Thus, if the ratio of AOP to a difference between $P_{reservoir}$ and $P_{bubble\ point}$ does not exceed the instability threshold, this may indicate a relatively lower likelihood of asphaltene instability due to an incompatible mixture of fluids (decision block 296), and so the reservoir may be modeled using a realization scenario of a single hydrocarbon charge (or multiple charges of relatively similar thermal maturities or compositions) (block 298). By contrast, if the ratio of AOP to a difference between $P_{reservoir}$ and $P_{bubble\ point}$ does exceed the instability threshold, this may indicate a relatively higher likelihood of asphaltene instability due to an incompatible mixture of fluids (decision block 296), and so the reservoir may be modeled using a realization scenario of multiple hydrocarbon charges of different maturities or compositions (block 300). Modeling the reservoir in this way may result in a more accurate simulation of the reservoir. Thus, results of the model simulation may be output to enable a well planner to make well development or production decisions (block 302). For example, the results of the model simulation may allow a well planner to select appropriate enhanced oil recovery techniques to increase reservoir productivity.

Figure 10:
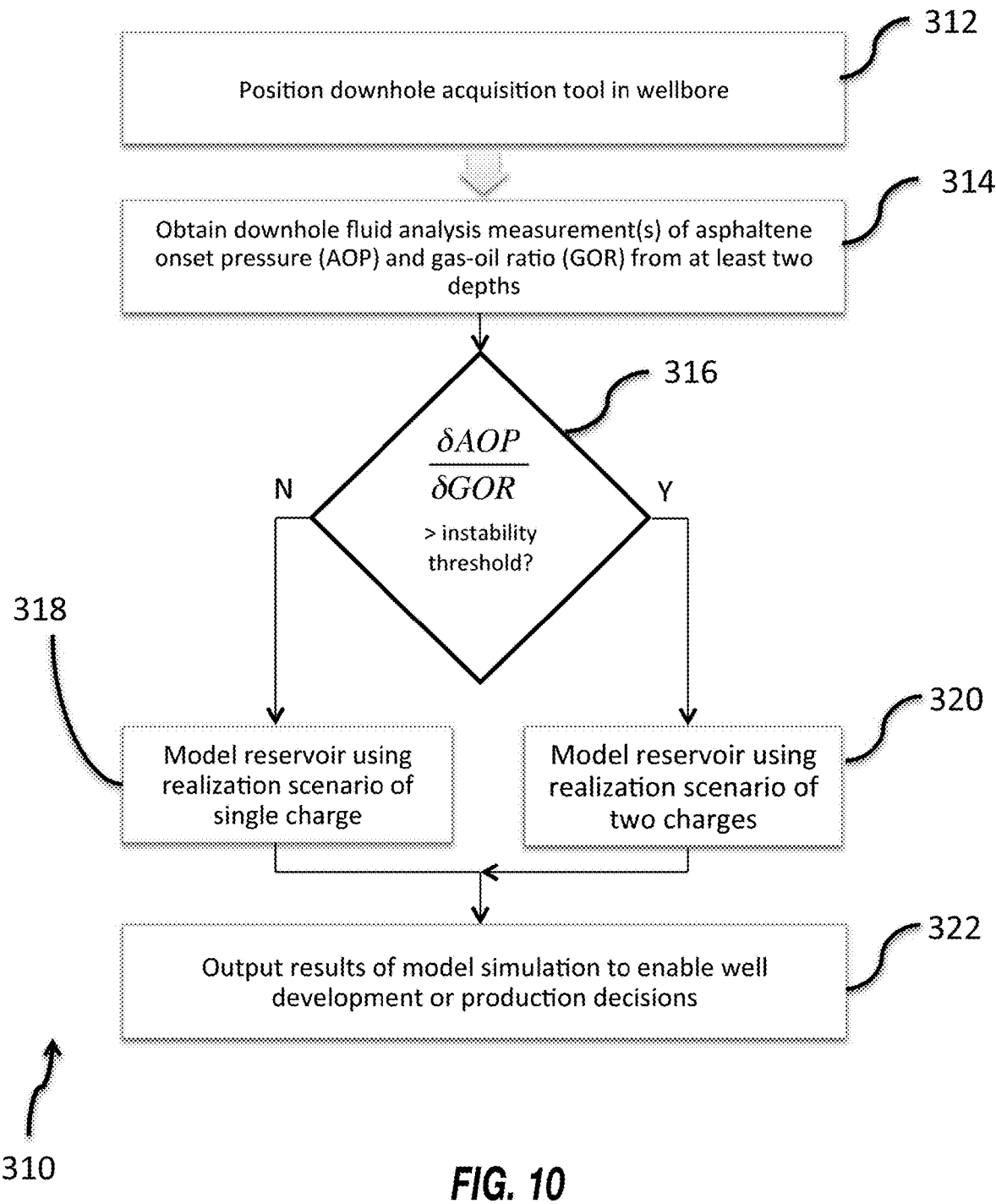
FIG. 10 is a flowchart of a method for identifying whether a reservoir likely underwent a single charge or multiple charges based on measurements of asphaltene onset pressure (AOP) and gas-oil ratio (GOR), as determined by a downhole acquisition tool, in accordance with an embodiment.

Multiple measurements may be used to identify a trendline indicative of asphaltene instability in a flowchart 310 of FIG. 10. The flowchart 310 begins as the downhole acquisition tool 12 or downhole acquisition tool 100 having the downhole fluid analysis system 42 is positioned in the wellbore 14 (block 312). The downhole fluid analysis system 42 may obtain at least two measurements of AOP and at least two measurements of gas-oil ratio (GOR) at two different respective depths (i.e., at a first depth, at least one measurement of AOP and at least one measurement of GOR; at a second depth, at least one measurement of AOP and at least one measurement of GOR) (block 314).

The relative change in AOP may be compared to the relative change in GOR (this is the slope $$\frac{\delta AOP}{\delta GOR})$$

by the data processing system 76 or electronics and processing system 106 to determine whether this ratio exceeds an instability threshold (decision block 316). The instability threshold may be a fixed value or may vary (e.g., based on other measured properties). Depending on a desired level of uncertainty, the instability threshold may be, for example: 4 psi/scf/bbl, 5 psi/scf/bbl, or 6 psi/scf/bbl, or the like. In one particular example, the instability threshold is 5 psi/scf/bbl or about 5 psi/scf/bbl.

Thus, if the slope $$\frac{\delta AOP}{\delta GOR}$$

ratio does not exceed the instability threshold, this may indicate a relatively lower likelihood of asphaltene instability due to an incompatible mixture of fluids (decision block 316), and so the reservoir may be modeled using a realization scenario of a single hydrocarbon charge (or multiple charges of relatively similar thermal maturities or compositions) (block 318). By contrast, if the slope $$\frac{\delta AOP}{\delta GOR}$$

does exceed the instability threshold, this may indicate a relatively higher likelihood of asphaltene instability due to an incompatible mixture of fluids (decision block 316), and so the reservoir may be modeled using a realization scenario of multiple hydrocarbon charges of different maturities or compositions (block 320).

This determination may be checked by also looking at thermal maturity markers Ts and Tm obtained by two-dimensional gas chromatography. A mixture of incompatible fluids with respect to asphaltene stability implies that the current GOR and asphaltene content does not match the thermal maturity biomarkers of the oil. The thermal maturity biomarkers in the oil are enriched in low maturity fluids and are of much lower concentration in high maturity fluids. Thus, a mixture of different maturity fluids would have thermal maturity biomarkers that are indicative of the lower maturity fluid in the mixture. Mixtures of different maturities would therefore be expected to have a high large ratio of Tm/(Tm+Ts) compared to the GOR and asphaltene content. If AOP increases with increasing GOR, then it is likely that these indicate incompatible mixtures with respect to asphaltene stability. Thus, it may be useful to check that the high GOR fluids (with high AOP) has low maturity (thus large ratio of Tm/(Tm+Ts)). If not, this may imply that the determination with respect to the slope of AOP and GOR may be inaccurate. In the case of maturity mixtures, the expectation is that elsewhere in the oilfield, reservoirs might contain one or the other of the different maturity fluids. In contrast, if increasing GOR trends with decreasing AOP, then we believe we have fluids of largely a single maturity. It may be useful to check that higher GOR trends with decreasing Tm/(Tm+Ts). If not, this may imply that the determination with respect to the slope of AOP and GOR may be inaccurate. Indeed, for a single maturity charge, the expectation is that more subtle changes in fluid composition should be observed elsewhere in the field.

Modeling the reservoir based on these determinations may produce a more accurate simulation of the reservoir. Thus, results of the model simulation may be output to enable a well planner to make well development or production decisions (block 322). For example, the results of the model simulation may allow a well planner to select appropriate enhanced oil recovery techniques to increase reservoir productivity.

Figure 11:
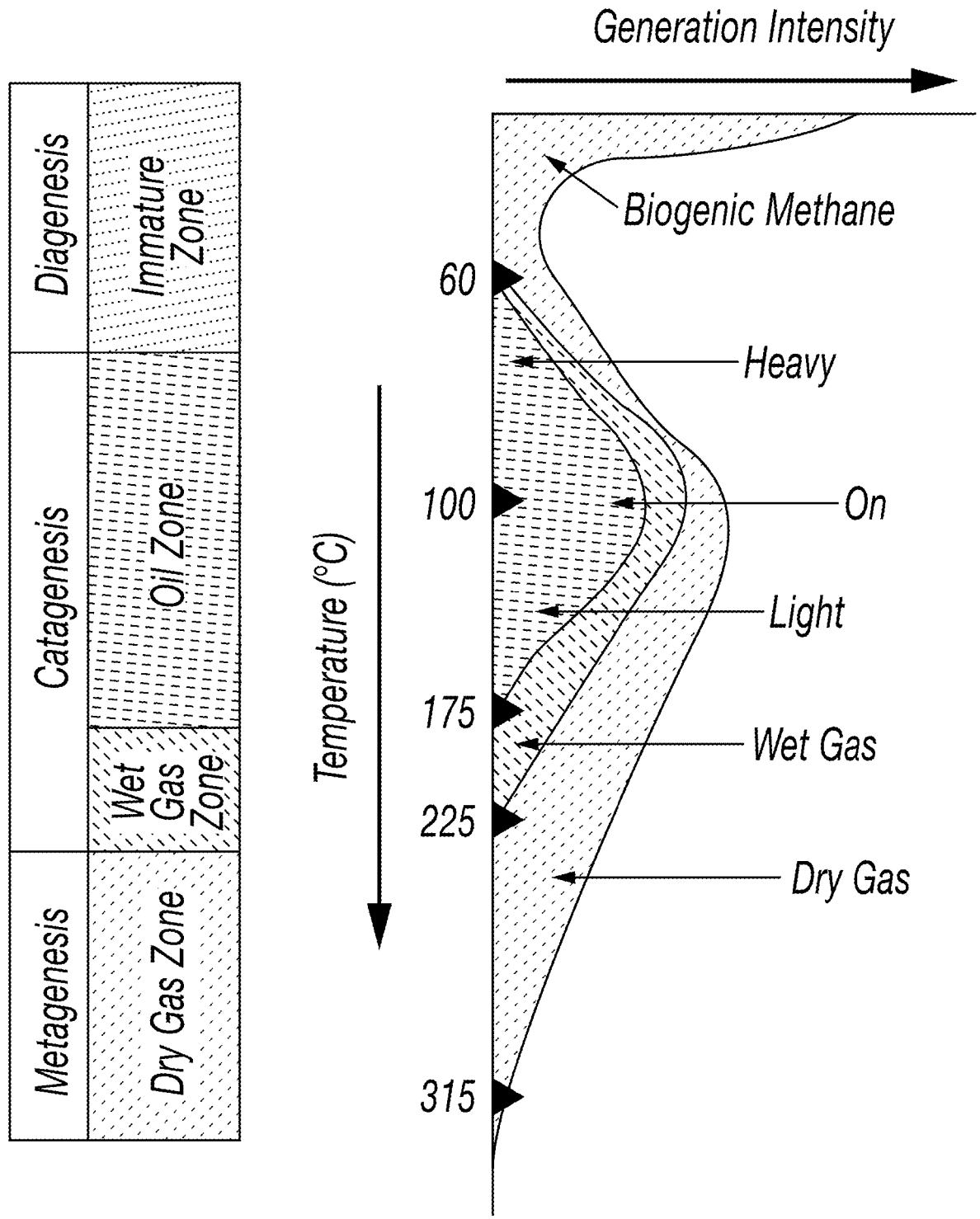
FIG. 11 is a diagram relating time, thermal maturity, and intensity of generation of hydrocarbon charges from an oil source rock into a reservoir.

It should be appreciated that hydrocarbons released into a reservoir may have thermal maturities that vary depending on a number of factors. FIG. 11 is a plot that relates thermal maturity of hydrocarbons generated in a charge to time and generation intensity. Maturity is difficult to quantify by a single number. Thus, maturity may be identified by gross properties such as GOR, API gravity, saturated hydrocarbon content, saturate/aromatic ratio, etc. as a proxy. As seen in FIG. 11, maturity of the source rock represents hydrocarbon release potential. Over time, depending on the generation intensity, the maturity of the hydrocarbon that is charged into a reservoir may vary.

It should be appreciated that the approaches discussed above may be used in combination. Moreover, rather than modeling the single or multiple charges, the data processing system may, additionally or alternatively, output an indication (e.g., on a well log or other visualization; e.g., an index or confidence value) of a likelihood of whether a single charge of similar thermal maturity or multiple charges of similar thermal maturity occurred vs. whether multiple charges of very different thermal maturity or composition occurred. Indeed, the specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A method comprising:
positioning a downhole acquisition tool in a wellbore in a geological formation;
testing one or more fluid properties of the formation fluid using the downhole acquisition tool, wherein the one or more fluid properties comprise a first asphaltene onset pressure obtained from a first depth, a second asphaltene onset pressure obtained from a second depth, a first gas-oil ratio obtained from the first depth, and a second gas-oil ratio obtained from a second depth, and wherein the relationship accords with a slope of a trend line between a first data point and a second data point, wherein the first data point includes the first asphaltene onset pressure and the first gas-oil ratio and the second data point includes the second asphaltene onset pressure and the second gas-oil ratio;
using first data processing circuitry to identify whether a relationship of the one or more fluid properties exceeds a first threshold that indicates likely asphaltene instability; and
when the relationship of the one or more fluid properties exceeds the first threshold, using the first data processing circuitry or other data processing circuitry to model the geological formation using a realization scenario in which multiple charges of hydrocarbons of substantially different thermal maturity or substantially different composition, or both, filled a reservoir of the geological formation over geologic time.

2. The method of claim 1, wherein the one or more fluid properties comprise an asphaltene onset pressure and the relationship comprises an absolute value of the asphaltene onset pressure.

3. The method of claim 2, wherein the first threshold comprises a value within a range of between about 8,000 psi and 15,000 psi.

4. The method of claim 2, wherein the first threshold comprises a value of about 10,000 psi.

5. The method of claim 1, wherein the one or more fluid properties comprise an asphaltene onset pressure and a reservoir pressure and the relationship comprises a ratio of the asphaltene onset pressure to the reservoir pressure.

6. The method of claim 5, wherein the first threshold comprises a value with a range of about 0.3 to 0.7.

7. The method of claim 5, wherein the first threshold comprises a value of about 0.5.

8. The method of claim 1, wherein the one or more fluid properties comprise an asphaltene onset pressure, a reservoir pressure, and a bubble point pressure, and the relationship comprises a ratio of the asphaltene onset pressure to a difference between the reservoir pressure and the bubble point pressure.

9. The method of claim 8, wherein the first threshold comprises a value with a range of about 0.5 to 0.9.

10. The method of claim 8, wherein the first threshold comprises a value of about 0.7.

11. The method of claim 1, wherein the first threshold comprises a value with a range of about 4 to 6 psi/scf/bbl.

12. The method of claim 1, wherein the first threshold comprises a value of about 5 psi/scf/bbl.

13. The method of claim 1, wherein the one or more fluid properties comprise thermal maturity biomarkers, wherein the first threshold comprises a value of a fraction of Tm/(Tm+Ts) thermal maturity biomarkers that exceeds about 0.8.

14. The method of claim 1, wherein the realization scenario in which multiple charges of hydrocarbons of substantially different thermal maturity or substantially different composition filled the reservoir comprises multiple charges of hydrocarbons of thermal maturity of a range that exceeds 30% variation of gas-oil ratio or asphaltene content.

15. One or more tangible, non-transitory, machine-readable media at least collectively comprising instructions executable on a processor to:
receive values of one or more fluid properties of formation fluid obtained using a downhole acquisition tool positioned in a geological formation; wherein the one or more fluid properties comprise a first asphaltene onset pressure obtained from a first depth, a second asphaltene onset pressure obtained from a second depth, a first gas-oil ratio obtained from the first depth, and a second gas-oil ratio obtained from a second depth, and wherein the relationship accords with a slope of a trend line between a first data point and a second data point, wherein the first data point includes the first asphaltene onset pressure and the first gas-oil ratio and the second data point includes the second asphaltene onset pressure and the second gas-oil ratio;
determine whether a relationship of the one or more fluid properties exceeds a first threshold that indicates likely asphaltene instability; and
when the relationship of the one or more fluid properties exceeds the first threshold, model the geological formation using a realization scenario in which multiple charges of hydrocarbons of substantially different thermal maturity or substantially different composition, or both, filled a reservoir of the geological formation over geologic time.

16. A method comprising:
positioning a downhole acquisition tool in a wellbore in a geological formation;
testing one or more fluid properties of the formation fluid using the downhole acquisition tool;
using first data processing circuitry to identify whether a relationship of the one or more fluid properties exceeds one or more thresholds that indicates likely asphaltene instability; and
based on whether the relationship of the one or more fluid properties exceeds one or more of the one or more thresholds, outputting an indication of a likelihood that a reservoir of the geological formation was filled over geologic time via multiple charges of hydrocarbons of substantially different thermal maturity or substantially different composition, or both;
wherein the one or more fluid properties comprise an asphaltene onset pressure and the relationship comprises an absolute value of the asphaltene onset pressure, wherein:
when the relationship of the one or more fluid properties exceeds a highest of the one or more thresholds, the indication of the likelihood indicates a relatively very high likelihood, wherein the highest of the one or more thresholds comprises a value within a range of about 10,000 psi to 20,000 psi;
when the relationship of the one or more fluid properties is lower than the highest of the one or more thresholds but exceeds a second-highest of the one or more thresholds, the indication of the likelihood indicates a relatively high likelihood, wherein the second-highest of the one or more thresholds comprises a value within a range of about 5,000 psi to 12,000 psi;
when the relationship of the one or more fluid properties is lower than the second-highest of the one or more thresholds but exceeds a lowest of the one or more thresholds, the indication of the likelihood indicates a relatively low likelihood, wherein the lowest of the one or more thresholds comprises a value within a range of about 0 psi to 6,000 psi; and
when the relationship of the one or more fluid properties is lower than the lowest of the one or more thresholds, the indication of the likelihood indicates a relatively lowest likelihood.

17. The method of claim 16, wherein:
when the relationship of the one or more fluid properties exceeds a highest of the one or more thresholds, the indication of the likelihood indicates a relatively high likelihood; and
when the relationship of the one or more fluid properties is within a lowest of the one or more thresholds, the indication of the likelihood indicates a relatively low likelihood.

18. The method of claim 16, comprising:
when the relationship of the one or more fluid properties exceeds the highest or the second highest of the one or more thresholds, using the first data processing circuitry or other data processing circuitry to model the geological formation using a realization scenario in which multiple charges of hydrocarbons of substantially different thermal maturity or substantially different composition, or both, filled the reservoir of the geological formation over geologic time.

* * * * *